(12) United States Patent
Warrier et al.

(10) Patent No.: US 12,182,139 B2
(45) Date of Patent: Dec. 31, 2024

(54) RECOMMENDER SYSTEM FOR TUNING PARAMETERS TO GENERATE DATA ANALYTICS MODEL AND METHOD THEREOF

(71) Applicant: HCL Technologies Limited, New Delhi (IN)

(72) Inventors: Harikrishna C Warrier, Bengaluru (IN); Yogesh Gupta, Noida (IN); Dhanyamraju S U M Prasad, Hyderabad (IN)

(73) Assignee: HCL Technologies Limited, New Delhi (IN)

( * ) Notice: Subject to any disclaimer, the term of this patent is extended or adjusted under 35 U.S.C. 154(b) by 154 days.

(21) Appl. No.: 17/690,183

(22) Filed: Mar. 9, 2022

(65) Prior Publication Data
US 2022/0300520 A1 Sep. 22, 2022

(30) Foreign Application Priority Data
Mar. 16, 2021 (IN) .............................. 202111011200

(51) Int. Cl.
G06F 16/2457 (2019.01)
G06F 16/25 (2019.01)
G06F 30/27 (2020.01)

(52) U.S. Cl.
CPC ...... G06F 16/24578 (2019.01); G06F 16/258 (2019.01); G06F 30/27 (2020.01)

(58) Field of Classification Search
CPC ... G06F 16/24578; G06F 16/258; G06F 30/27

USPC ......................................................... 707/723
See application file for complete search history.

(56) References Cited

U.S. PATENT DOCUMENTS

| | | | |
|---|---|---|---|
| 9,489,630 B2 * | 11/2016 | Achin | G06N 5/02 |
| 10,466,978 B1 | 11/2019 | Vidan et al. | |
| 10,614,382 B1 | 4/2020 | Wu | |
| 10,713,594 B2 | 7/2020 | Szeto et al. | |
| 2016/0275406 A1 * | 9/2016 | Chan | G06N 5/022 |

(Continued)

OTHER PUBLICATIONS

Charu C. Aggarwal, An Introduction to Recommender Systems. In: Recommender Systems. Springer, Cham, Mar. 29, 2016, Print ISBN: 978-3-319-29657-9, Online ISBN: 978-3-319-29659-3, Springer International Publishing Switzerland 2016.

*Primary Examiner* — Hosain T Alam
*Assistant Examiner* — Saba Ahmed
(74) *Attorney, Agent, or Firm* — Kendal M. Sheets

(57) ABSTRACT

The disclosure relates to method and system recommending tuning of parameters to generate a data analytics model. The method includes identifying at a data pre-processing stage a pre-processing subset from an associated set of predefined pre-processing methods for a predefined objective. The method includes identifying at a feature selection stage a feature subset from an associated set of predefined feature selection methods for the predefined objective. The method includes identifying at a model training stage a training subset from an associated set of predefined model training methods for the predefined objective. The method further includes generating a plurality of data analytics tuples and selecting a data analytics tuple from the plurality of data analytics tuples. An output result of the data analytics tuple includes highest ranked results for the predefined objective.

13 Claims, 10 Drawing Sheets

(56) References Cited

U.S. PATENT DOCUMENTS

| | | | |
|---|---|---|---|
| 2017/0124487 A1* | 5/2017 | Szeto | G06F 11/1448 |
| 2017/0132817 A1* | 5/2017 | Mahajan | G06N 3/105 |
| 2020/0274894 A1* | 8/2020 | Argoeti | H04L 63/1433 |
| 2022/0300520 A1* | 9/2022 | Warrier | G06N 20/00 |
| 2022/0301001 A1* | 9/2022 | Patil | G06Q 30/0236 |

* cited by examiner

RECOMMENDER SYSTEM FOR TUNING PARAMETERS TO GENERATE DATA ANALYTICS MODEL AND METHOD THEREOF

TECHNICAL FIELD

This disclosure relates generally to data analytics models, and more particularly to method and system for adjusting and modifying parameters to generate data analytics model.

BACKGROUND

Typically, a data analytics model has multiple varying stages ranging from data ingestion to data pre-processing, feature selection, and model training. In each of these stages a user is provided with multiple choices that may be applied to curate data to be made available to a next consecutive stage. Prevalent data analytics training mechanisms leave choice of selecting the options for the pre-processing stage and the feature selection stage to the user, and based on the options selected by the user, the data is transformed and made available for training. In addition, in the model training stage, an algorithm selection and scoring criteria to be evaluated is also left to the user.

Though the user may personally specify customized options for individual problems, the mechanism suffers from drawbacks such as non-evaluation of all possible available options, and the non-utilized option to be one of an optimized parameters to be used to solve a problem. Therefore, there is a need in the art for improved methods and systems for recommending tuning of parameters to generate the data analytics model.

SUMMARY

In an embodiment, a method for recommending tuning of parameters to generate a data analytics model is disclosed. In one example, the method may include identifying at a data pre-processing stage, for each of a plurality of pre-processing operations, a pre-processing subset from an associated set of predefined pre-processing methods for a predefined objective by a recommender device. Each pre-processing subset may include a list of ranked predefined pre-processing methods. The method may further include identifying at a feature selection stage, for each of a plurality of feature selection operations, a feature subset from an associated set of predefined feature selection methods for the predefined objective. Each feature subset may include a list of ranked predefined feature selection methods. The method may further include identifying at a model training stage, for each of a plurality of model training operations, a training subset from an associated set of predefined model training methods for the predefined objective. Each training subset may include a list of ranked predefined model training methods. The method may further include generating a plurality of data analytics tuples. Each of the plurality of data analytics tuples may include a predefined pre-processing method selected from the associated pre-processing subset, a predefined feature selection method selected from the associated feature subset, and a predefined model training method selected from the associated training subset. The method may further include selecting a data analytics tuple from the plurality of data analytics tuples. An output result of the data analytics tuple may include highest ranked results for the predefined objective, and the data analytics tuple corresponds to the data analytics model.

In another embodiment, a system for recommending tuning of parameters to generate a data analytics model is disclosed. In one example, the system may include a recommender device comprising a processor and a memory communicatively coupled to the processor, wherein the memory stores processor-executable instructions, which, on execution, may cause the processor to identify at a data pre-processing stage for each of a plurality of pre-processing operations, a pre-processing subset from an associated set of predefined pre-processing methods for a predefined objective. Each pre-processing subset may include a list of ranked predefined pre-processing methods. The processor-executable instructions, on execution, may further cause the processor to identify at a feature selection stage for each of a plurality of feature selection operations, a feature subset from an associated set of predefined feature selection methods for the predefined objective. Each feature subset may include a list of ranked predefined feature selection methods. The processor-executable instructions, on execution, may further cause the processor to identify at a model training stage for each of a plurality of model training operations, a training subset from an associated set of predefined model training methods for the predefined objective. Each training subset may include a list of ranked predefined model training methods. The processor-executable instructions, on execution, may further cause the processor to generate a plurality of data analytics tuples. Each of the plurality of data analytics tuples may include a predefined pre-processing method selected from the associated pre-processing subset, a predefined feature selection method selected from the associated feature subset, and a predefined model training method selected from the associated training subset. The processor-executable instructions, on execution, may further cause the processor to select a data analytics tuple from the plurality of data analytics tuples. An output result of the data analytics tuple may include highest ranked results for the predefined objective, and the data analytics tuple may correspond to the data analytics model.

In another embodiment, a computer program product for recommending tuning of parameters to generate a data analytics model is disclosed. In one example, the computer program product is embodied in a non-transitory computer readable storage medium of a recommender device and comprises computer instructions for identifying at a data pre-processing stage, for each of a plurality of pre-processing operations, a pre-processing subset from an associated set of predefined pre-processing methods for a predefined objective. Each pre-processing subset may include a list of ranked predefined pre-processing methods. The computer instructions may further include identifying at a feature selection stage, for each of a plurality of feature selection operations, a feature subset from an associated set of predefined feature selection methods for the predefined objective. Each feature subset may include a list of ranked predefined feature selection methods. The computer instructions may further include identifying at a model training stage, for each of a plurality of model training operations, a training subset from an associated set of predefined model training methods for the predefined objective. Each training subset may include a list of ranked predefined model training methods. The computer instructions may further include generating a plurality of data analytics tuples. Each of the plurality of data analytics tuples may include a predefined pre-processing method selected from the associated pre-processing subset, a predefined feature selection method selected from the associated feature subset, and a predefined model training method selected from the associated training subset. The computer instructions may further include selecting a data analytics tuple from the plurality of data analytics tuples. An output result of the data analytics tuple may include highest ranked results for the predefined objective, and the data analytics tuple corresponds to the data analytics model.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims. Additional illustrative embodiments are listed below.

Figure 1:
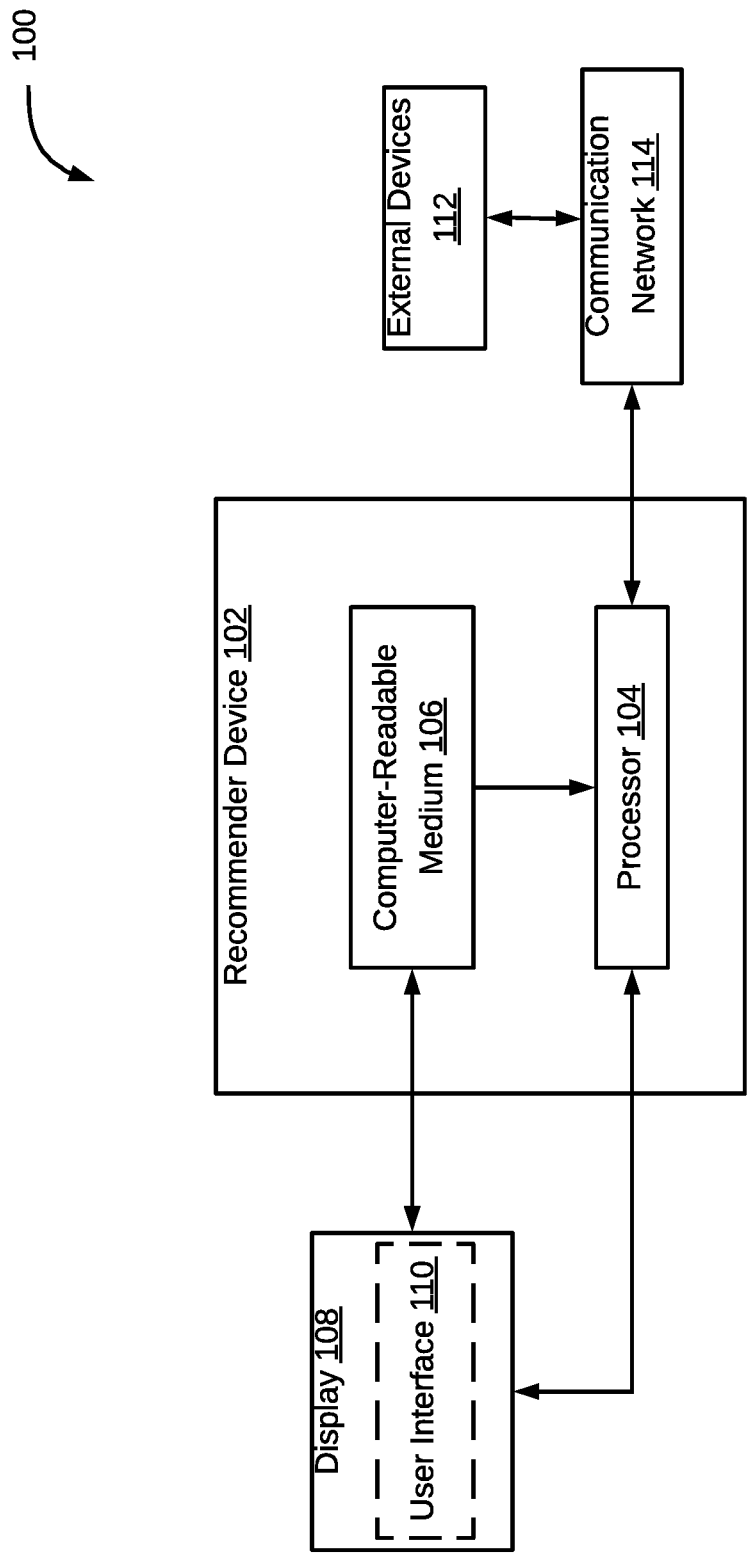
FIG. 1 is a block diagram of an exemplary system for recommending tuning of parameters to generate a data analytics model, in accordance with some embodiments.

Referring now to FIG. 1, an exemplary system 100 for recommending tuning of parameters to generate a data analytics model is illustrated, in accordance with some embodiments. The system 100 may implement a recommender device 102 (for example, a server, a desktop, a laptop, a notebook, a netbook, a tablet, a smartphone, a mobile phone, or any other computing device), in accordance with some embodiments. The recommender device 102 may recommend tuning of parameters (e.g., data processing parameters, feature selection parameters, model training parameters) to generate a data analytics model by identifying a pre-processing subset from an associated set of predefined pre-processing methods, a feature subset from an associated set of predefined feature selection methods, and a training subset from an associated set of predefined model training methods.

It should be noted that, in some embodiments, for identification at the data pre-processing stage, the recommender device 102 may generate, for each of a plurality of pre-processing operations, a pre-processing subset from an associated set of predefined pre-processing methods, and may assign, for each of the plurality of pre-processing operations, a rank to each predefined pre-processing method in an associated pre-processing subset. The plurality of pre-processing operations may include, but are not limited to at least one of an impute operation, an outlier detection operation, an outlier treatment operation, a rescale operation, and a transform operation. Further, for identification at the feature selection stage, the recommender device 102 may generate for each of a plurality of feature selection operations, a feature subset from an associated set of predefined selection methods, and may assign, for each of the plurality of feature selection operations, a rank to each predefined feature selection method in an associated feature subset. The plurality of feature selection operations may include, but are not limited to at least one of a correlation operation, a model-based operation, and a feature reduction operation. Additionally, for identification at the model training stage, the recommender device 102 may generate for each of the plurality of model training operations, a training subset from an associated set of predefined model training methods, and assign, for each of the plurality of model training operations, a rank to each predefined model training method in an associated training subset. The plurality of model training operations may include at least one of, but are not limited to an algorithm selection operation, a hyperparameters tuning operation, and a model optimization operation.

As will be described in greater detail in conjunction with FIGS. 2-9, the recommender device 102 may transform an input data to generate transformed data based on the predefined objective. The recommender device 102 may transform the input data. The transformation may include processing at the data pre-processing stage. The processing at this stage may include processing, through a first plurality of recommendation layers, the input data, multiple sets of predefined pre-processing methods, and a list of problem types associated with the predefined objective, to generate a set of pre-processed data. Further, each set in the plurality of sets of predefined pre-processing methods may correspond to a pre-processing operation from the plurality of pre-processing operations. Further, each of set of predefined pre-processing methods, at the data pre-processing stage, may be ranked based on a criteria appropriate for each of set of predefined pre-processing methods. The first plurality of recommendation layers may include a predefined statistical and quantitative method layer, a pre-defined rules and practices layer, and a predefined meta learning-based layer. Additionally, the ranks is assigned after processing through the first plurality of recommendation layers based on an associated criteria.

The recommender device 102 may transform the input data to generate the transformed data. This may further include processing at the feature selection stage, through a second plurality of recommendation layers, the set of pre-processed data, the plurality of sets of predefined feature selection methods, and the list of problem types, to generate a transformed data. Each set in the plurality of sets of predefined feature selection methods may correspond to a feature selection operation from a plurality of feature selection operations. Further, at the feature selection stage, ranking of each of the set of predefined feature selection methods is performed based on a criteria appropriate for the each of set of predefined feature selection methods. The second plurality of recommendation layers may include a predefined statistical and quantitative method layer, a predefined rules and practices layer, and a predefined meta learning-based layer. Additionally, the ranks are assigned after processing through the second plurality of recommendation layers based on an associated criteria.

Once the input data has been processed to generate the transformed data, the recommender device 102 may process at a model training stage, through a third plurality of recommendation layers, the transformed data, the plurality of sets of predefined model training methods, and the list of problem types. Each set in the multiple sets of predefined model training methods may correspond to a model training operation from a plurality of model training operations. Further, at the model training stage, the third plurality of recommendation layers may include a pre-defined statistical and quantitative method layer, a pre-defined rules and practices layer, and a predefined meta learning-based layer. Additionally, the ranks are assigned after processing through the third plurality of recommendation layers based on an associated criteria.

The system 100 may further include a display 108. The system 100 may interact with a user via a user interface 110 accessible via the display 108. The system 100 may also include one or more external devices 112. In some embodiments, the recommender device 102 may interact with the one or more external devices 112 over a communication network 114 for sending or receiving various data. The external devices 112 may include, but may not be limited to, a remote server, a digital device, or another computing system.

Figure 2:
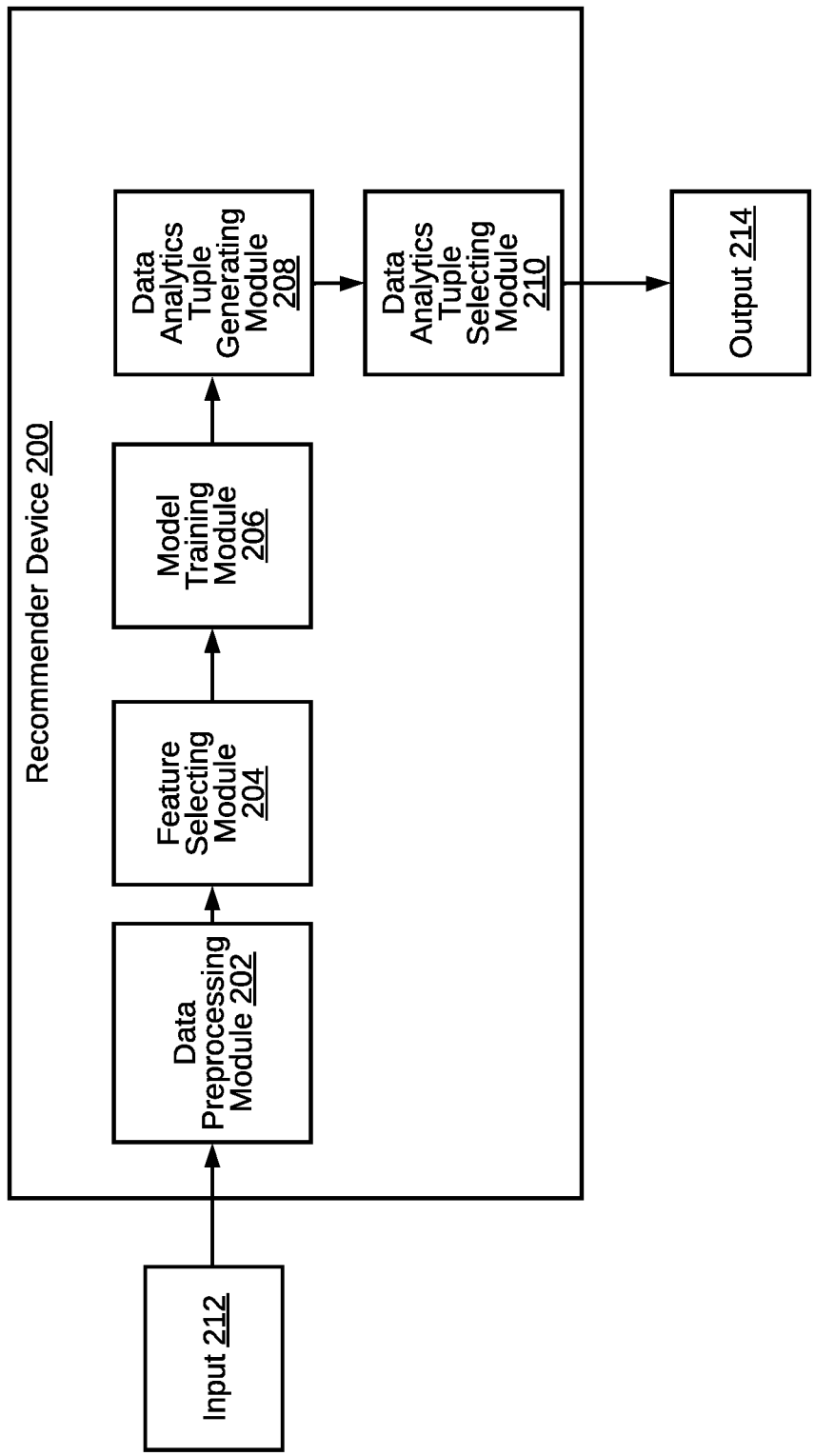
FIG. 2 illustrates a functional block diagram of a recommender device implemented by the exemplary system of FIG. 1, in accordance with some embodiments.

Referring now to FIG. 2, a functional block diagram of a recommender device 200 is illustrated, in accordance with some embodiments. In an embodiment, the recommender device 200 may include a data preprocessing module 202, a feature selecting module 204, a model training module 206, a data analytics tuple generating module 208, and a data analytics tuple selecting module 210. In such an embodiment, the recommender device 200 may be analogous to the recommender device 102 of the system 100.

For recommending tuning of parameters to generate a data analytics model, an input data 212 may be transformed to generate a transformed data based on a predefined objective. In an embodiment, transformation of the input data 212 may include processing at a data pre-processing stage, through a first plurality of recommendation layers, the input data, a plurality of sets of predefined pre-processing methods, and a list of problem types associated with the predefined objective, to generate a set of pre-processed data. Each set in the multiple sets of predefined pre-processing methods may correspond to a pre-processing operation from the plurality of pre-processing operations.

The data preprocessing module 202 may at the data pre-processing stage, identify, for each of the plurality of pre-processing operations, a pre-processing subset from an associated set of predefined pre-processing methods for the predefined objective. Each pre-processing subset may include a list of ranked predefined pre-processing methods. As an example, the pre-processing methods may include such as a missing values handling method, data outliers and out of range values handling method, a data transformation and re-scaling method, and the like.

The identification at the data pre-processing stage may include generating for each of the plurality of pre-processing operations, the pre-processing subset from the associated set of predefined pre-processing methods. This may be based on the result of processing through each of the first plurality of recommendation layers. The first plurality of recommendation layers may include a pre-defined statistical and quantitative method layer, a pre-defined rules and practices layer, and a predefined meta learning-based layer. It will be apparent to a person skilled in the art that the processing via the first plurality of recommendation layers may be sequential or parallel. The multiple pre-processing operations may include at least one of an impute operation, an outlier detection operation, an outlier treatment operation, a rescale operation, and a transform operation.

Further, for each of the plurality of pre-processing operations, a rank may be assigned to each predefined pre-processing method in the associated pre-processing subset. Additionally, each of set of predefined pre-processing methods, at the data pre-processing stage, may be ranked. The ranking may be performed based on a criteria appropriate for each of set of predefined pre-processing methods. As discussed before, the ranking may be based on processing via the first plurality of recommendation layers.

For each of the plurality of feature selection operations, the feature selecting module 204, at a feature selection stage, may identify a feature subset from an associated set of predefined feature selection methods for the predefined objective. Each feature subset may include a list of ranked predefined feature selection methods. As an example, the predefined feature selection methods may include such as a high cardinality and low variance features handling method, a high dimensionality of features handling method, noisy features handling method, a number of features reducing method, and the like.

Further, transforming the input data 212 to generate the transformed data may include processing, at the feature selection stage, through a second plurality of recommendation layers, the set of pre-processed data, the plurality of sets of predefined feature selection methods, and the list of problem types. Each set in the plurality of sets of predefined feature selection methods may correspond to a feature selection operation from a plurality of feature selection operations. The plurality of feature selection operations may include, but are not limited to at least one of a correlation operation, a model-based operation, and a feature reduction operation.

In an embodiment, identifying at the feature selection stage may include generating for each of the multiple feature selection operations, the feature subset from the associated set of predefined feature selection methods. The feature subset may be generated based on the result of processing through each of the second plurality of recommendation layers. Further, for each of the plurality of feature selection operations, a rank may be assigned to each predefined feature selection method in the associated feature subset. The ranking of each predefined feature selection method, at the feature selection stage, may be performed based on a criteria appropriate for each of the set of predefined feature selection methods. The second plurality of recommendation layers may include a pre-defined statistical and quantitative method layer, a pre-defined rules and practices layer, and a predefined meta learning-based layer.

The model training module 206, may identify, for each of multiple model training operations, a training subset from an associated set of predefined model training methods for the predefined objective. Each training subset may include a list of ranked predefined model training methods. Further, processing at a model training stage is done through a third plurality of recommendation layers based on the transformed data, the plurality of sets of predefined model training methods, and the list of problem types. Each set in the plurality of sets of predefined model training methods may correspond to a model training operation from multiple model training operations. The plurality of model training operations may include at least one of an algorithm selection operation, a hyperparameters tuning operation, and a model optimization operation.

As an example, the predefined model training methods may include such as a varied class of problems handling method, multiple models (ML/DL) handling method, optimizing model parameters method, required scoring criteria fitting method, and the like. In an embodiment, identification at the model training stage may include generating for each of the plurality of model training operations, the training subset from the associated set of predefined model training methods, based on the result of processing through each of the third plurality of recommendation layers. Further, for each of the plurality of model training operations, a rank may be assigned to each predefined model training method in the associated training subset. Additionally, at the model training stage, the ranking of the each predefined model training method may be performed based on a criteria appropriate for the each of set of predefined model training methods. The third plurality of recommendation layers may include a pre-defined statistical and quantitative method layer, a pre-defined rules and practices layer, and a pre-defined meta learning-based layer.

The data analytics tuple generating module 208, may generate a plurality of data analytics tuples. Each of the plurality of data analytics tuples may include a predefined pre-processing method selected from the associated pre-processing subset, a predefined feature selection method selected from the associated feature subset, and a predefined model training method selected from the associated training subset. In an exemplary embodiment, the data analytics tuple generating module 208 may facilitate to generate a set of transformed data. This may be done by listing down and exposing all possible data vectors that may participate in a model training process. Further, the plurality of data analytics tuples may be depicted as a matrix of possible combinations, for example, data preprocessing options, feature selection options, and the like.

The data analytics tuple selecting module 210 may select a data analytics tuple from the plurality of data analytics tuples. An output result of the data analytics tuple may include highest ranked results for the predefined objective. Further, the data analytics tuple may correspond to the data analytics model.

It should be noted that all such aforementioned modules 202-210 may be represented as a single module or a combination of different modules. Further, as will be appreciated by those skilled in the art, each of the modules 202-210 may reside, in whole or in parts, on one device or multiple devices in communication with each other. In some embodiments, each of the modules 202-210 may be implemented as dedicated hardware circuit comprising custom application-specific integrated circuit (ASIC) or gate arrays, off-the-shelf semiconductors such as logic chips, transistors, or other discrete components. Each of the modules 202-210 may also be implemented in a programmable hardware device such as a field programmable gate array (FPGA), programmable array logic, programmable logic device, and so forth. Alternatively, each of the modules 202-210 may be implemented in software for execution by various types of processors (e.g., processor 104). An identified module of executable code may, for instance, include one or more physical or logical blocks of computer instructions, which may, for instance, be organized as an object, procedure, function, or other construct. Nevertheless, the executables of an identified module or component need not be physically located together, but may include disparate instructions stored in different locations which, when joined logically together, include the module and achieve the stated purpose of the module. Indeed, a module of executable code could be a single instruction, or many instructions, and may even be distributed over several different code segments, among different applications, and across several memory devices.

As will be appreciated by one skilled in the art, a variety of processes may be employed for identifying common requirements from applications. For example, the exemplary system 100 and the associated the recommender device 102 may identify common requirements from applications by the processes discussed herein. In particular, as will be appreciated by those of ordinary skill in the art, control logic and/or automated routines for performing the techniques and steps described herein may be implemented by the system 100 and the associated the recommender device 102 either by hardware, software, or combinations of hardware and software. For example, suitable code may be accessed and executed by the one or more processors on the system 100 to perform some or all of the techniques described herein. Similarly, application specific integrated circuits (ASICs) configured to perform some or all of the processes described herein may be included in the one or more processors on the system 100.

Figure 3A:
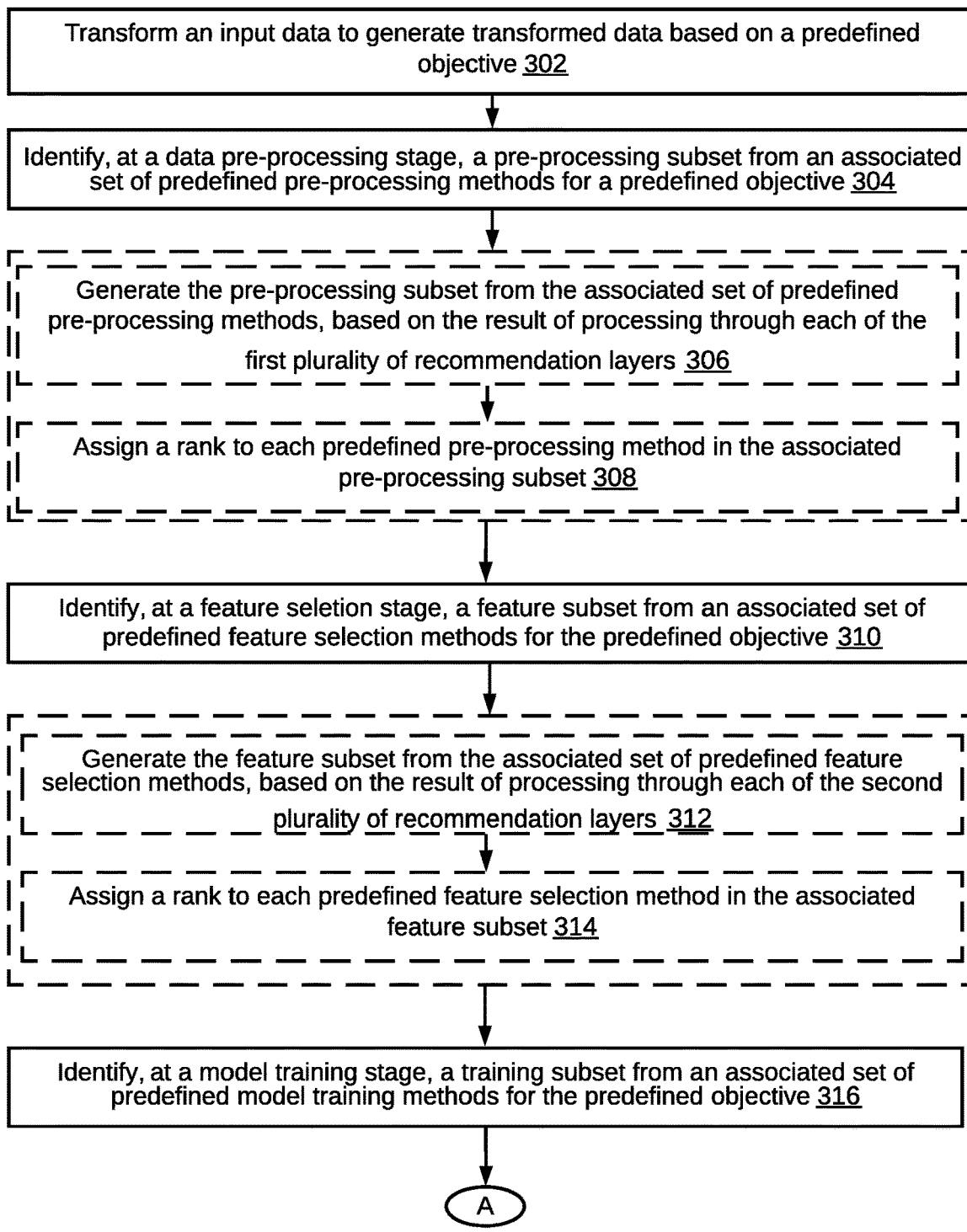
FIGS. 3A and 3B, illustrate an exemplary process for recommending tuning of parameters to generate a data analytics model, in accordance with some embodiments.
Figure 3B:
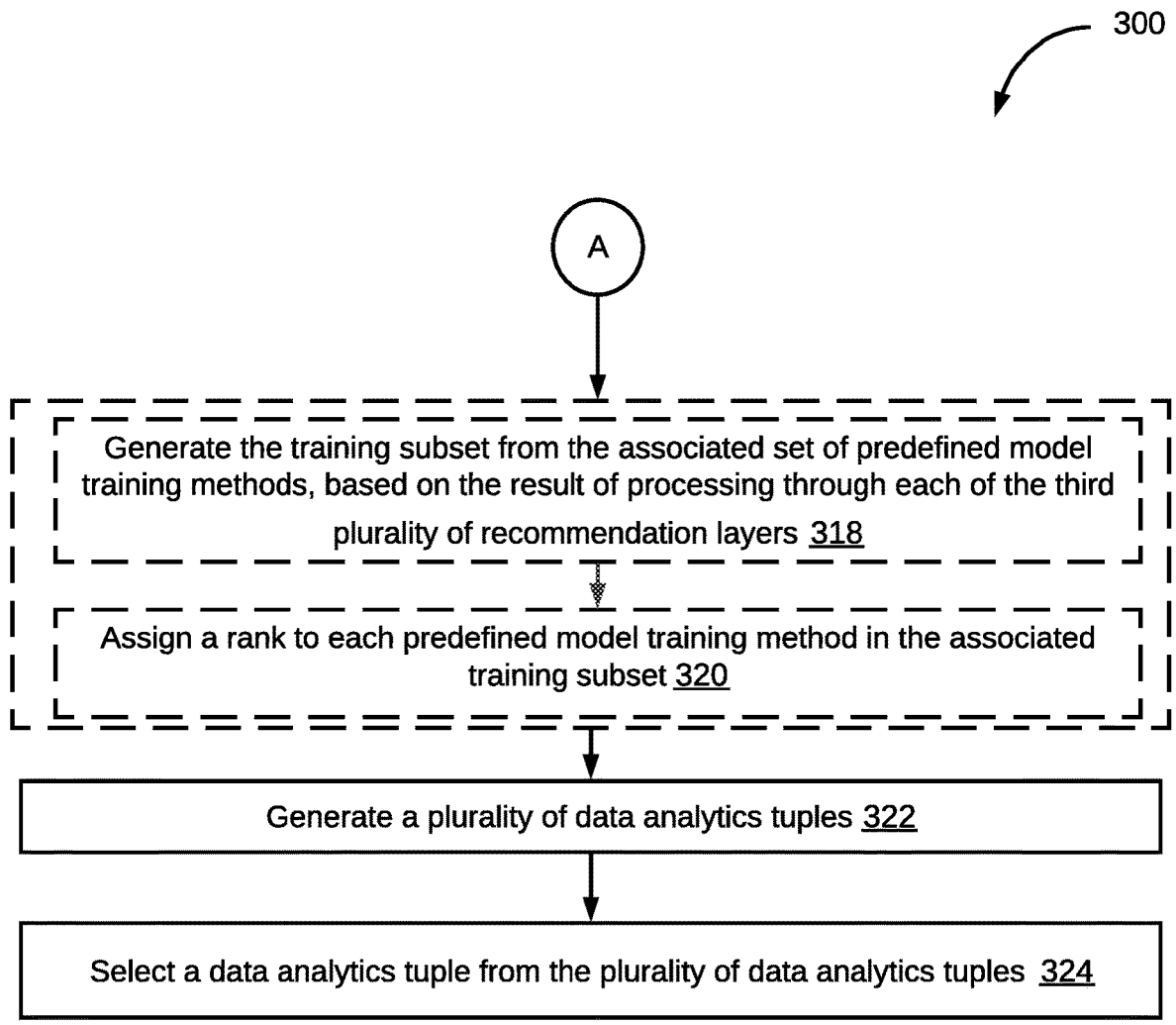

Referring now to FIGS. 3A and 3B, an exemplary process 300 for recommending tuning of parameters to generate a data analytics model is depicted via a flowchart, in accordance with some embodiments. The process 300 may be implemented by the recommender device 102 of the system 100. The process 300 may include transforming an input data to generate transformed data based on a predefined objective at step 302. As may be appreciated, transforming the input data may include processing at the data pre-processing stage, through a first plurality of recommendation layers, the input data, multiple sets of predefined pre-processing methods, and a list of problem types associated with the predefined objective. The transformation of the input data is done to generate a set of pre-processed data. Each set in the multiple sets of predefined pre-processing methods may correspond to a pre-processing operation from the multiple pre-processing operations.

In an embodiment, transforming the input data to generate the transformed data further includes processing at the feature selection stage, through a second plurality of recommendation layers, the set of pre-processed data, the plurality of sets of predefined feature selection methods, and the list of problem types, to generate a transformed data. It may be noted that each set in the multiple sets of predefined feature selection methods may correspond to a feature selection operation from multiple feature selection operations. Each of the first plurality and second plurality of recommendation layers may include a pre-defined statistical and quantitative method layer, a pre-defined rules and practices layer, and a predefined meta learning-based layer. The process 300 may further include identifying, at a data pre-processing stage, for each of a plurality of pre-processing operations, a pre-processing subset from an associated set of predefined pre-processing methods for a predefined objective, at step 304. It may be noted that each preprocessing subset may include a list of ranked predefined pre-processing methods. In an exemplary embodiment, the plurality of pre-processing operations may include at least one of an impute operation, an outlier detection operation, an outlier treatment operation, a rescale operation, and a transform operation. In some embodiments, the identification at the data pre-processing stage may include generating for each of the multiple pre-processing operations, the pre-processing subset from the associated set of predefined pre-processing methods. The pre-processing subset may be generated based on the result of processing through each of the first plurality of recommendation layers, at step 306. Additionally, for each of the plurality of pre-processing operations, a rank may be assigned to each predefined pre-processing method in the associated pre-processing subset, at step 308, based on processing via the first plurality of recommendation layers.

Further, the process 300 may include identifying at a feature selection stage, for each of a plurality of feature selection operations, a feature subset from an associated set of predefined feature selection methods for the predefined objective at step 310. Each feature subset may include a list of ranked predefined feature selection methods. In an exemplary embodiment, the plurality of feature selection operations may include at least one of a correlation operation, a model-based operation, and a feature reduction operation.

Further, identification at the feature selection stage includes generating for each of the plurality of feature selection operations, the feature subset from the associated set of predefined feature selection methods at step 312. The feature subset may be generated based on the result of processing through each of the second plurality of recommendation layers. Additionally, for each of the plurality of feature selection operations, a rank may be assigned to each predefined feature selection method in the associated feature subset, at step 314.

In an embodiment, the process 300 may include identifying at a model training stage, for each of multiple model training operations, a training subset from an associated set of predefined model training methods for the predefined objective at step 316. It may be noted that each training subset may include a list of ranked predefined model training methods. In an exemplary embodiment, the multiple model training operations include at least one of an algorithm selection operation, a hyperparameters tuning operation, and a model optimization operation. Further, at step 318, the training subset may be generated for each of the multiple model training operations from the associated set of predefined model training methods. The training subset may be generated based on the result of processing through each of the third plurality of recommendation layers. The third plurality of recommendation layers may also include a pre-defined statistical and quantitative method layer, a pre-defined rules and practices layer, and a predefined meta learning-based layer. Additionally, at step 320, a rank may be assigned to each predefined model training method in the associated training subset.

In another exemplary embodiment, the data analytics tuple generating module 208 may generate a plurality of data analytics tuples at step 322. It may be noted that each of the plurality of data analytics tuples may include a predefined pre-processing method selected from the associated pre-processing subset, a predefined feature selection method selected from the associated feature subset, and a predefined model training method selected from the associated training subset. In yet another exemplary embodiment, the data analytics tuple selecting module 210 may select a data analytics tuple from the plurality of data analytics tuples at step 324. It may be noted that an output result of the data analytics tuple may include highest ranked results for the predefined objective. In addition, the data analytics tuple may correspond to the data analytics model.

Figure 4:
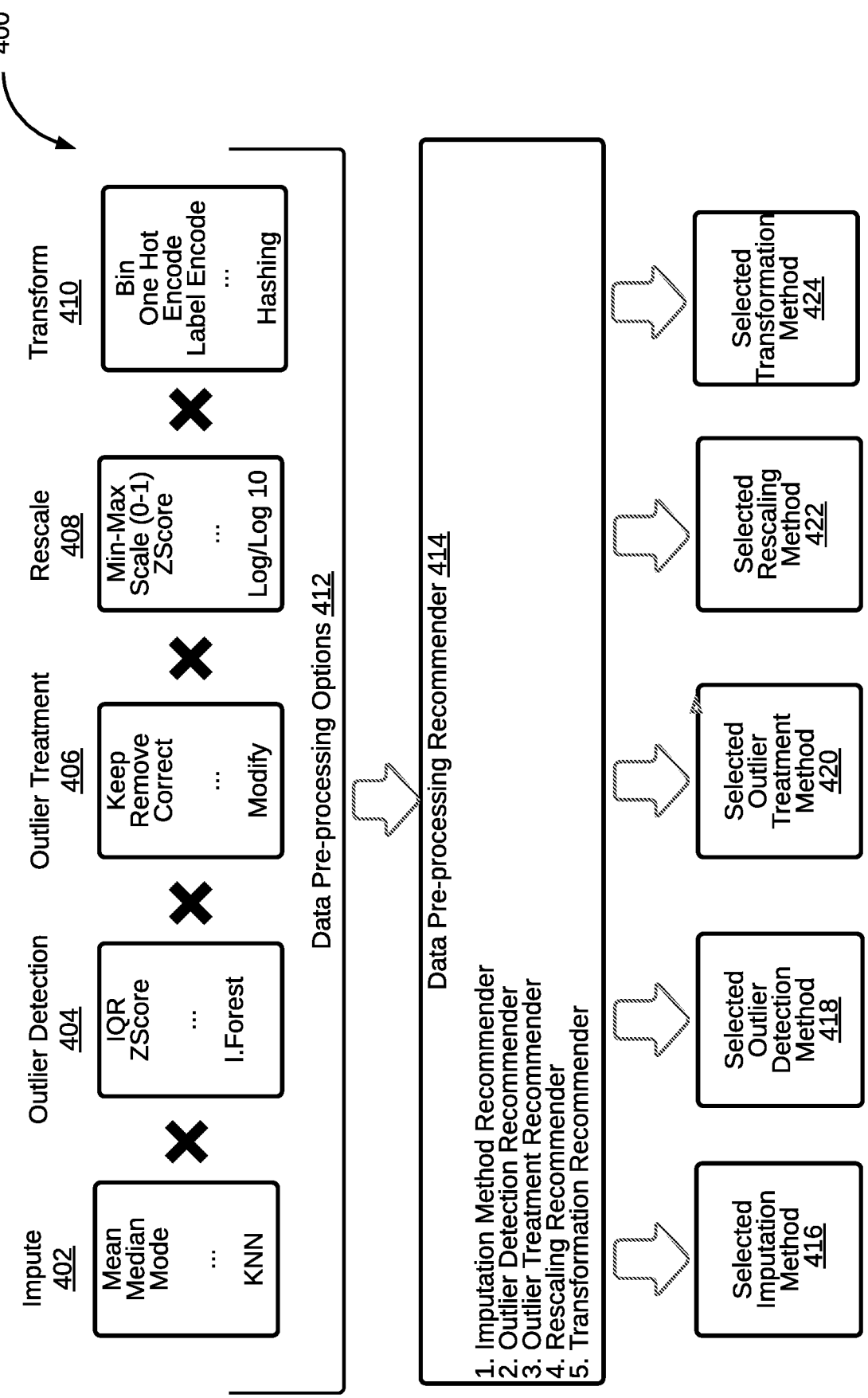
FIG. 4 illustrates an exemplary functioning of the recommender device of the system, at a data pre-processing stage, in accordance with some embodiments.

Referring now to FIG. 4, at 400, an exemplary functioning of the recommender device 102 of the system 100, at the data pre-processing stage, is illustrated, in accordance with some embodiments. With reference to FIG. 4, a data pre-processing recommender 414 may receive as input—an input data, different choices made by a user from options available for each set of pre-processing options at block 412, and a problem type (e.g., classification, regression, forecasting, etc.).

To optimize the set of choices for a given problem, the data pre-processing recommender 414 may take in all the options and may give out best set of choices. The data pre-processing options, at block 412, may include an impute treatment at block 402. The impute treatment at block 402 may include methods such as mean, median, mode, K-Nearest Neighbors (KNN), etc. Additionally, the impute treatment at block 402 may include methods such as to discard entries with missing values in their attributes, use maximum likelihood procedures, where the parameters of a model for complete data are estimated, and later used for imputation by means of sampling, and by imputation of missing values that may be based on a set of procedures that aims to fill in missing values with estimated ones.

At block 404, an outlier detection operation may include methods that may be based on statistical analysis techniques such as Inter-quartile range, z-score etc. and model based techniques such as Isolation Forest (I.Forest), regression analysis etc. At block 406, an outlier treatment operation may include methods such as keep, remove, correct, modify, etc. As an example, choices for outlier detection operation may be based on statistical analysis techniques such as Inter-quartile range, z-score etc. and model based techniques such as Isolation Forest, regression analysis etc. Further, at block 408, rescale operation may include methods such as normalize, re-scale, rank, min-max, scale (0-1), Zscore etc. Additionally, at block 410, transform operation may include methods such as bin, one hot encode, label encode, hashing, etc. As may be appreciated, by using the data pre-processing options, at block 412, there may be availability of a huge number of options in data pre-processing stage itself, and if a combination of the options is taken together, a total number of possibilities may be much higher, as total number of choices may be a product of the possibilities.

Thereafter, the data pre-processing recommender 414 may rank the received choices for each of the operation (e.g., the impute treatment at block 402, the outlier detection operation at block 404, an outlier treatment operation at block 406, the rescale operation at block 408, the transform operation at block 410) based on a criteria appropriate for each of the operation. In an embodiment, the data pre-processing recommender 414 may result in generation of a selected imputation method, at block 416, for the corresponding impute treatment, at block 402, using, for example, an imputation method recommender. Further, a selected outlier detection method, at block 418, may be generated for the corresponding outlier detection operation, at block 404, using, for example, an outlier detection recommender. Additionally, a selected outlier treatment method, at block 420, may be generated for the outlier treatment operation, at block 406, using, for example, an outlier treatment recommender. Further, a selected rescaling method, at block 422, may be generated for the rescale operation, at block 408, using, for example, a rescaling recommender. Additionally, a selected transformation method, at block 424, may be generated for the transformation operation, at block 410, using, for example, a transformation recommender.

In another embodiment, a criteria for imputation method ranking may be based on a least noise induced and by ones that maintain close relationship with a target. Further, a criteria for outlier detection method ranking may be based on how the outliers may be categorized into different types. Furthermore, a criteria for outlier treatment method ranking may be based on noise and influence of treatment on the target. Additionally, criteria for rescaling and transformation method ranking may be based on importance of the features. It may be noted that top N ranks (e.g., depend on how many configurable choices are required by the user) may be a plurality of selected strategies that may be availed by the user. The top N ranks may be provided as a list of choices for each set of operations that may be ranked in an order of preference which the user may use to run the pipeline.

In an embodiment, the data pre-processing recommender 414 may include, but is not limited to three main components. These three main components may correspond to the first plurality of recommendation layers. The data pre-processing recommender 414 may provide recommendations to the user on a best set of choices for each of the operation based on the three components. One of the components may facilitate to use statistical methods and quantitative methods, that may include methods (but not limited to) (a) determining influence of the operation on the data with respect to quantifying the noise induced by the method, (b) determining a degree of change in relationship of the data with respect to the target due to the corresponding operation, and (c) performing standard deviation analysis and/or percentage analysis due to the operation. Another component may facilitate to use well defined rules and best practices, with respect to aspects such as but not limited to, (a) stabilizing the variances, (b) linearize relationships, (c) data transformations based on the problem type, (d) types of outliers, and (e) sampling and discretization. Yet another component may facilitate to use meta learning-based approaches, that include but are not limited to (a) estimating degree of change based on scores of predictors and based on residual scores, (b) estimation using regression and modeling techniques, and (c) estimating degree of importance based on results of algorithms.

Figure 5:
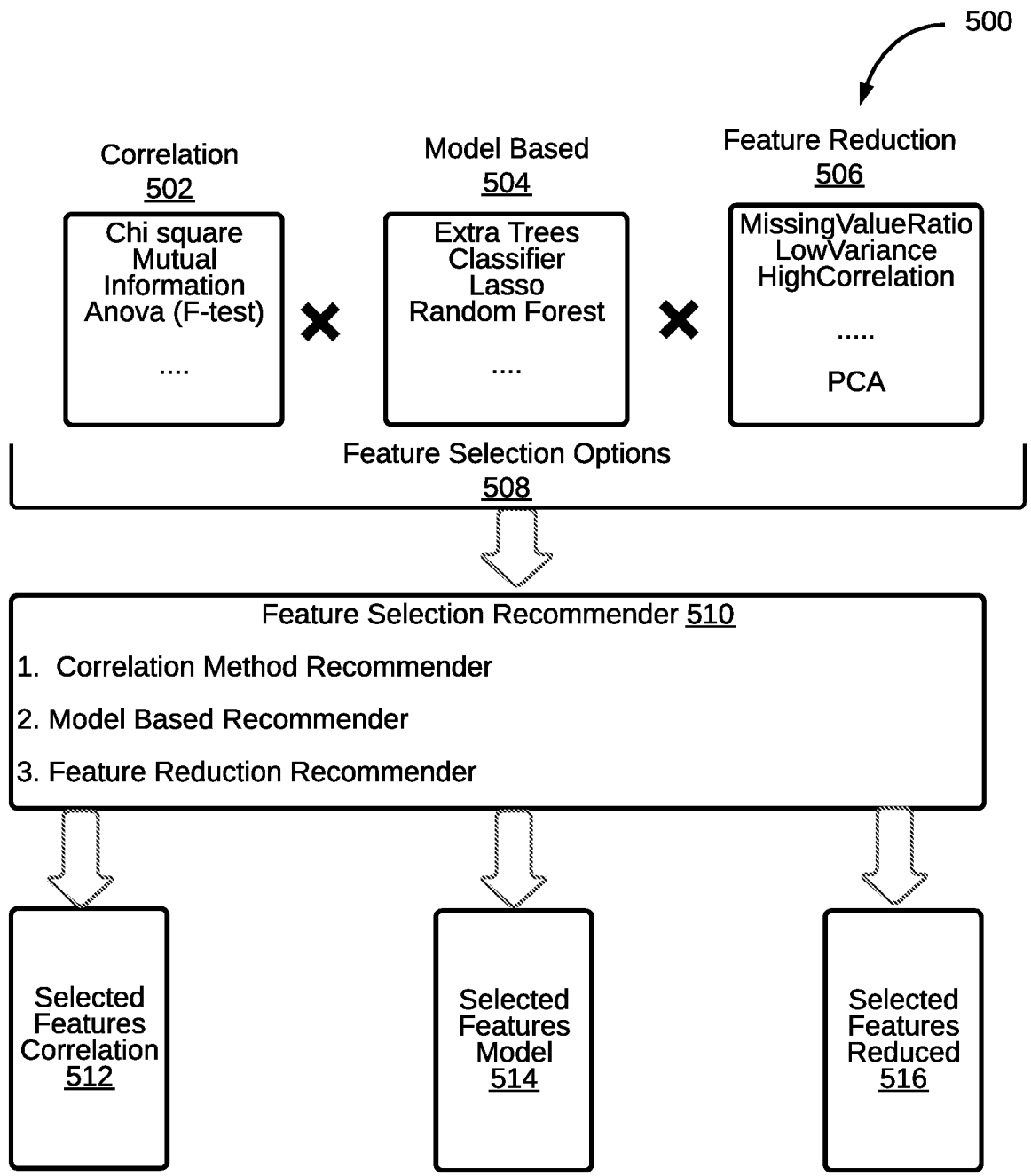
FIG. 5 illustrates an exemplary functioning of the recommender device of the system, at a feature selection stage, in accordance with some embodiments.

Referring now to FIG. 5, at 500, an exemplary functioning of the recommender device 102 of the system 100, at the feature selection stage, is illustrated, in accordance with some embodiments. With reference to FIG. 5, a feature selection recommender 510 may receive as input—a list of choices for each set of feature selection options available at block 508, pre-processed data received from the data pre-processing stage, and a type of problem (e.g., classification, regression, forecasting etc.). To optimize the set of choices for a given problem, the feature selection recommender 510 may take in all the options and may give out best set of choices.

The feature selection options, at block 508, may categorize operations in multiple (e.g., three) broad categories. The categories for the operations may be such as a correlation or statistical based feature selection operation at block 502, a model based or meta learning based feature selection operation at block 504, and a feature reduction or dimensionality reduction operation at block 506. In an embodiment, the correlation operation, at block 502, may include methods such as Chi Square, mutual information, Anova (F-Test), etc. At block 504, the model based operation may include methods such as extra tree classifier, lasso, random forest etc. Further, at block 506, the feature reduction operation may include methods such as missing value ratio, low variance, high correlation, Principal Component Analysis (PCA), Singular Value Decomposition (SVD), etc. As may be appreciated, by using the feature selection options, at block 508, there may be availability of a huge number of options in data feature selection stage, and if a combination of the options is taken together, a total number of possibilities may be much higher, as total number of choices may be a product of the possibilities.

Thereafter, the feature selection recommender 510 may rank the received choices for each of the operation (e.g., the correlation operation at block 502, a model based or meta learning based feature selection operation at block 504, and a feature reduction or dimensionality reduction operation at block 506) based on a criteria appropriate for each of the operation. In an embodiment, the feature selection recommender 510 may result in generation of a selected features correlation method, at block 512, for the corresponding correlation operation, at block 502, using for example, a correlation method recommender. Further, a selected features method, at block 514, may be generated for the corresponding model based operation, at block 504, using, for example, a model based recommender. Additionally, a selected features reduced method, at block 516, may be generated for the corresponding feature reduction operation, at block 506, using, for example, a feature reduction recommender.

In another embodiment, a criteria for correlation-based features may be set as per a correlation threshold selected by the user. Further, a criteria for model-based feature selection may be established as per a degree of importance threshold selected by the user. Furthermore, a criteria for feature reduction may be based on a percentage of variance to be captured as selected by the user. It may be noted that top N ranks (e.g., depend on how many configurable choices are required by the user) may be multiple selected strategies that may be availed by the user. The top N ranks may be provided as a list of choices for each set of operations that may be ranked in an order of preference which the user may use to run the pipeline.

In an embodiment, the feature selection recommender 510 may have but not limited to three main components. These three main components may correspond to the second plurality of recommendation layers. The feature selection recommender 510 may provide recommendations to the user on a best set of choices for each of the operation based on the three components. One of the component may facilitate to use statistical methods and quantitative methods, that may include methods (but not limited to) (a) determining cross correlation between features, (b) determining correlation with respect to the target, (c) determining cardinality of the features, and (d) variance of the features. Another component may facilitate to use well defined rules and best practices, with respect to aspects such as but not limited to, (a) stabilizing the variances, (b) linearize relationships, (c) data transformations based on the problem type, (d) types of outliers, and (e) sampling and discretization. Yet another component may facilitate to use meta learning-based approaches, that include but are not limited to (a) estimation features to be selected based on components of the features, and (b) estimating degree of importance based on modelling techniques.

Figure 6:
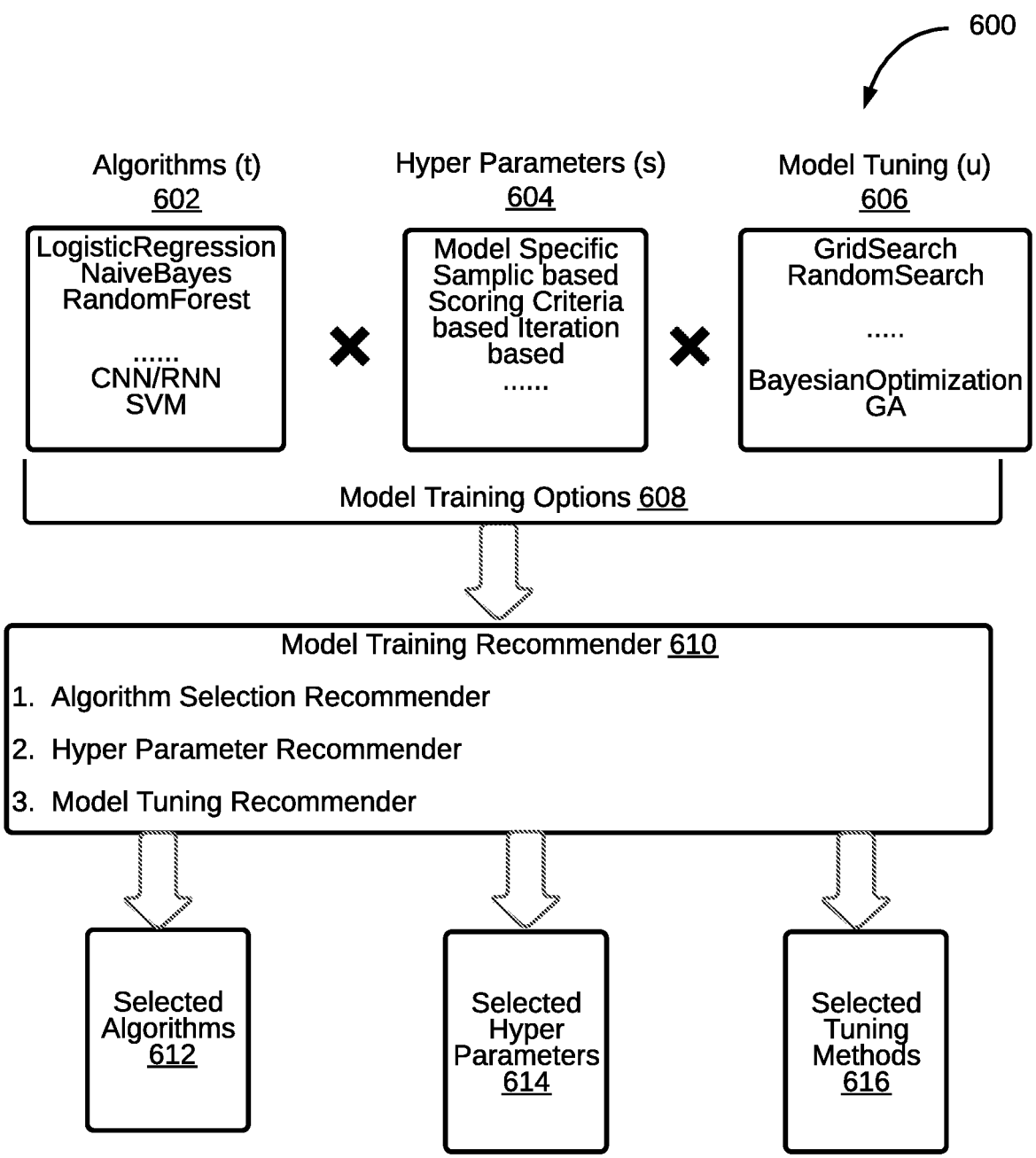
FIG. 6 illustrates an exemplary functioning of the recommender device of the system, at a model training stage, in accordance with some embodiments.

Referring now to FIG. 6, at 600, an exemplary functioning of the recommender device 102 of the system 100, at the model training stage, is illustrated, in accordance with some embodiments. With reference to FIG. 6, a model training recommender 610 may receive as input—a list of choices for each set of model training options available at block 608, transformed data received from the feature selection stage, and a type of problem (e.g., classification, regression, forecasting etc.). To optimize the set of choices for a given problem, the model training recommender 610 may take in all the options and may give out best set of choices.

The model training options, at block 608, may categorize operations in multiple (e.g., three) broad categories. The categories for the operations may be such as an algorithm(s) operation at block 602, a hyper parameter(s) operation at block 604, and a model tuning operation at block 606. In an embodiment, the algorithms (t) operation at block 602, may include methods such logisticregression, naivebayes, randomforest, Convolution Neural Network (CNN)/Recurrent Neural Network (RNN), Support Vector Machine (SVM), etc. At block 604, the hyper parameters (s) operation may include methods such as a model specific, sampling based, scoring criteria based, iteration based, etc. Further, at block 606, the model tuning operation (u) may include methods such as gridsearch, randomsearch, bayesianoptimization, Genetic Algorithm (GA), Neural Architecture Search (NAS) etc. As may be appreciated, by using model training options, at block 608, there may be availability of a huge number of options at the model training stage. Also, additional options may be available from the earlier discussed data pre-processing stage and the feature selection stage. At the model training stage, a model training recommender may take in all the options and may give out a best set of choices.

Thereafter, the model training recommender 610 may rank the received choices for each of the operation (e.g., the algorithms operation at block 602, a hyperparameters operation at block 604, and a model tuning operation at block 506) based on a criteria appropriate for each of the operation. In an embodiment, the model training recommender 610 may result in generation of a selected algorithms method, at block 612, for the corresponding algorithms operation, at block 602, using for example, an algorithm selection recommender. Further, a selected hyper parameters method, at block 614, may be generated for the corresponding hyperparameters operation, at block 604, using, for example, a hyper parameter recommender. Additionally, a selected tuning method, at block 616, may be generated for the corresponding model tuning operation, at block 606, using, for example, a model tuning recommender.

In another embodiment, the model training recommender 610 may rank the available choices of algorithms and top N ranks (e.g., depend on how many configurable choices are required by the user) may be a plurality of selected strategies that may be availed by the user. For the selected list of algorithms, the model training recommender 610 may also rank the hyper-parameters and the tuning methods. The user may then again select top 'X' methods out of the ranked hyper-parameters and the tuning methods. The ranked methods may be provided as a list of choices for each set of operations. The methods may be ranked in an order of preference which the user may use to run the pipeline.

In an embodiment, the model training recommender 610 may have but not limited to three main components. These three main components may correspond to the third plurality of recommendation layers. The model training recommender 610 may provide recommendations to the user on a best set of choices for each of the operation based on the three components. One of the component may facilitate to use metrics that may pertain to an algorithm, and may include (but not limited to): (a) type of scoring criteria selected, (b) degree to which the results match the scoring criteria, (c) degree to which other metrics may deviate, and (d) bias-variance threshold that may be permitted. Another component may facilitate an algorithm selection, with respect to following pointers such as but not limited to, (a) size of data, (b) linearity of data, (c) nature of target, (d) computational constraint, and (e) explain-ability and interpretability of the model. Yet another component may facilitate tuning method selection, that include but are not limited to (a) degree to which the results may converge, (b) computational complexity, and (c) using benchmarks and comparisons with historical data.

Figure 7:
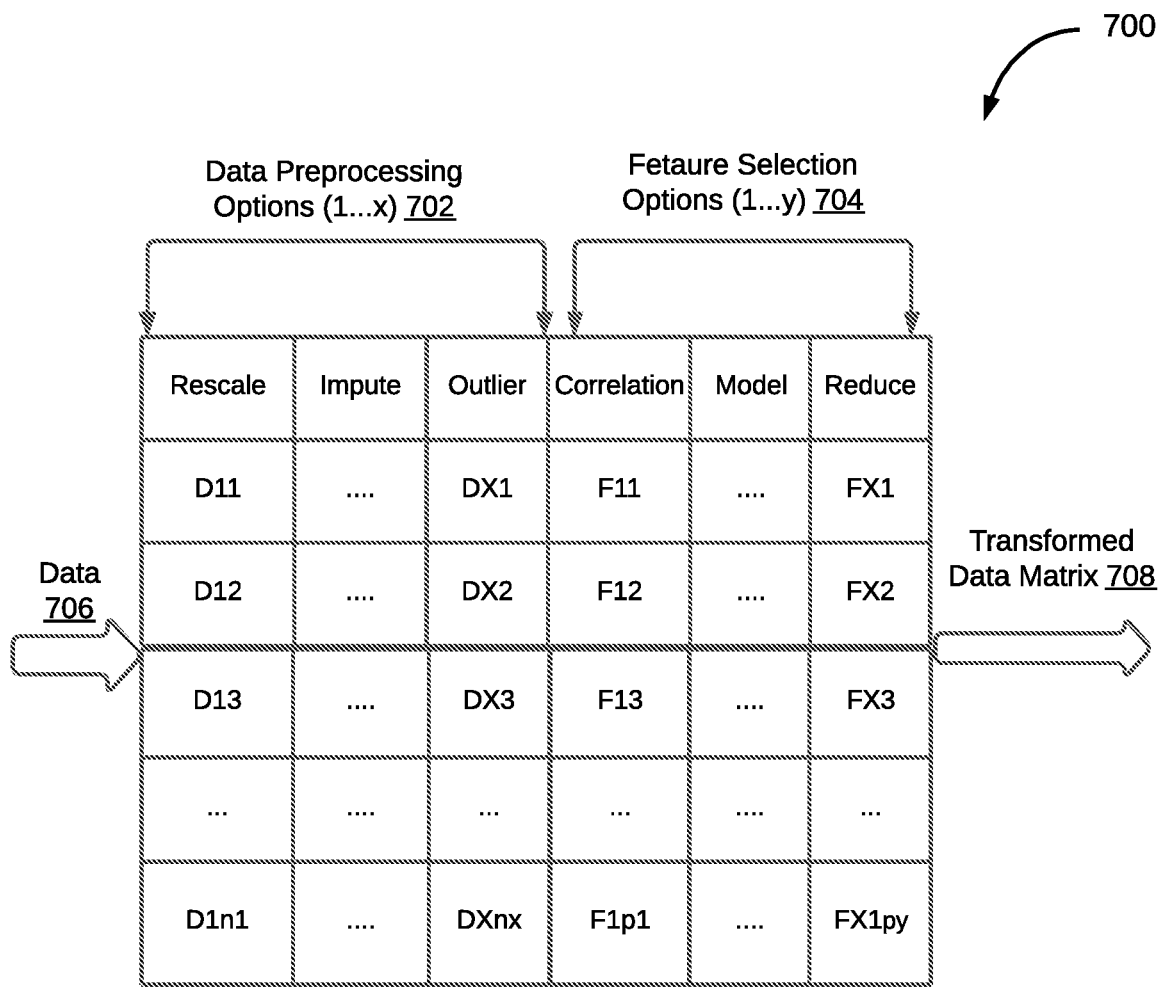
FIG. 7 is an exemplary representation of a transformation options pipeline, in accordance with some embodiments.

Referring now to FIG. 7, an exemplary representation of a transformation options pipeline is illustrated at 700, in accordance with some embodiments. With respect to FIG. 7, all possible combinations of options are passed as input data (at block 706). The input data may be determined at data pre-processing stage (at block 702) and at feature selection stage (at block 704) through their corresponding recommenders to generate a set of transformed data, represented as a transformed data matrix at block 708. Further, all possible combination of options may be depicted as a matrix including multiple possible combinations. Thereafter, the system may list down and expose all possible data vectors determined in the matrix to participate in a model training process.

Figure 8:
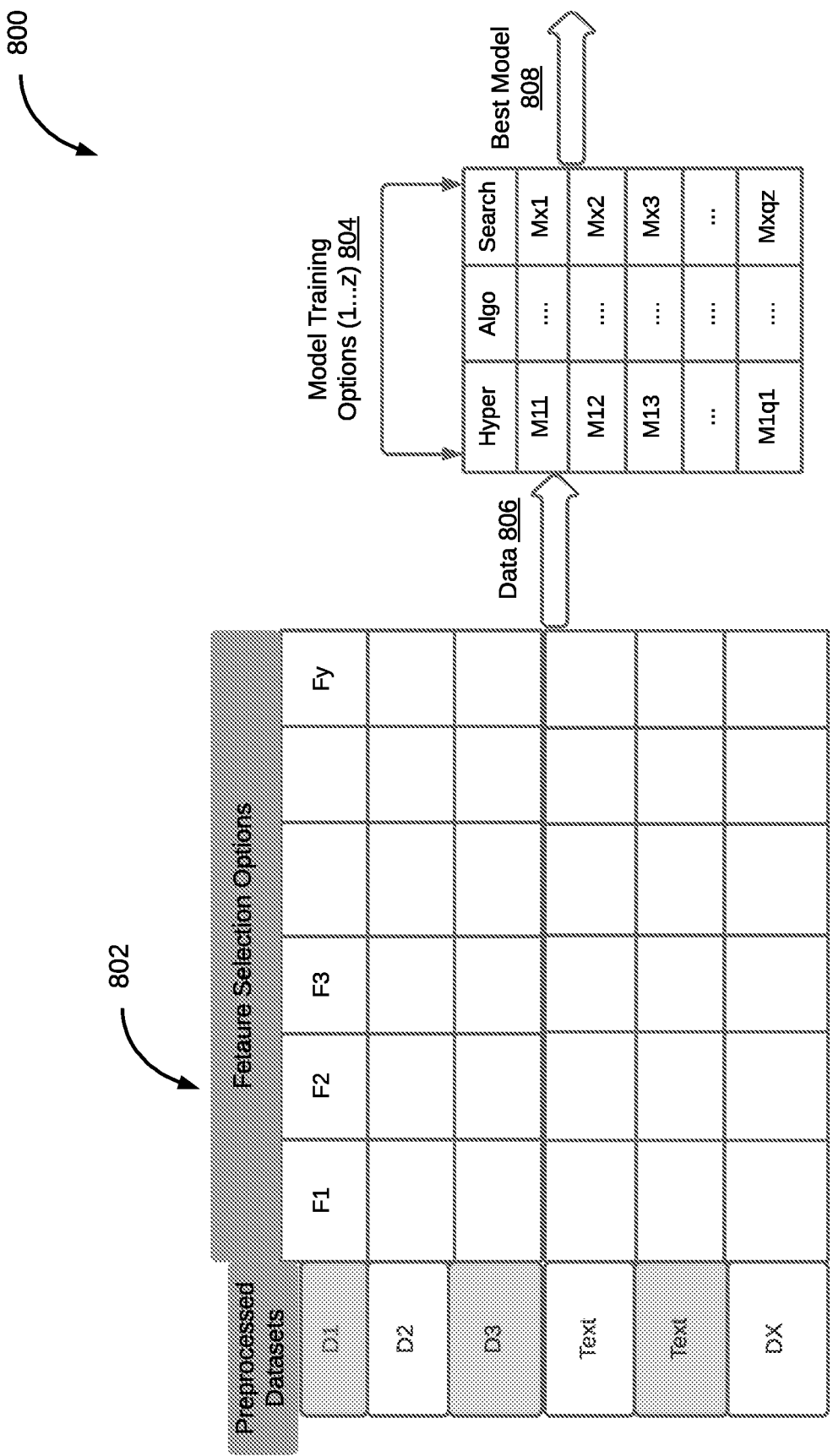
FIG. 8 is an exemplary representation of a pipeline tuning matrix, in accordance with some embodiments.

Referring now to FIG. 8, an exemplary representation of a pipeline tuning matrix is illustrated at 800, in accordance with some embodiments. In an exemplary embodiment, if at the data pre-processing stage a total number of options are say, for example, 'D' possible options (represented at block 802), and if at the feature selection stage, the total number of options are say, for example, 'F' possible options (represented at block 802), and if the model training stage has a total of say, for example, 'M' possible options, a pipeline parameter generation matrix may be generated (at block 802). Further, the set of transformed data (at block 806), generated from the pipeline parameter generation matrix may be sent through a model training recommender with determined model training options (at block 804), to obtain a best model (at block 808).

In an embodiment, the pipeline tuning matrix 800 may be generated based on a pipeline tuning algorithm. The algorithm may follow the following series of steps: (a) receiving input data, (b) receiving user input on all data pre-processing options, feature selection options, and model training options that needs to be evaluated. The options may be received in form of a configuration file or in any other format, (c) using the received data pre-processing options to create an entire set of data vectors as outlined in the data pre-processing stage using a data pre-processing recommender, (d) using the feature selection options to create an entire set of feature vectors as an outline in the feature selection stage using the feature selection recommender system, (e) running the generated transformed data through the model training stage as outlined using the model training recommender system for each of the tuples and store the result of each iteration, and (f) choosing the data pre-processing, feature selection and model tuning tuple that generates best results.

As will be also appreciated, the above described techniques may take the form of computer or controller implemented processes and apparatuses for practicing those processes. The disclosure can also be embodied in the form of computer program code containing instructions embodied in tangible media, such as floppy diskettes, solid state drives, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

Figure 9:
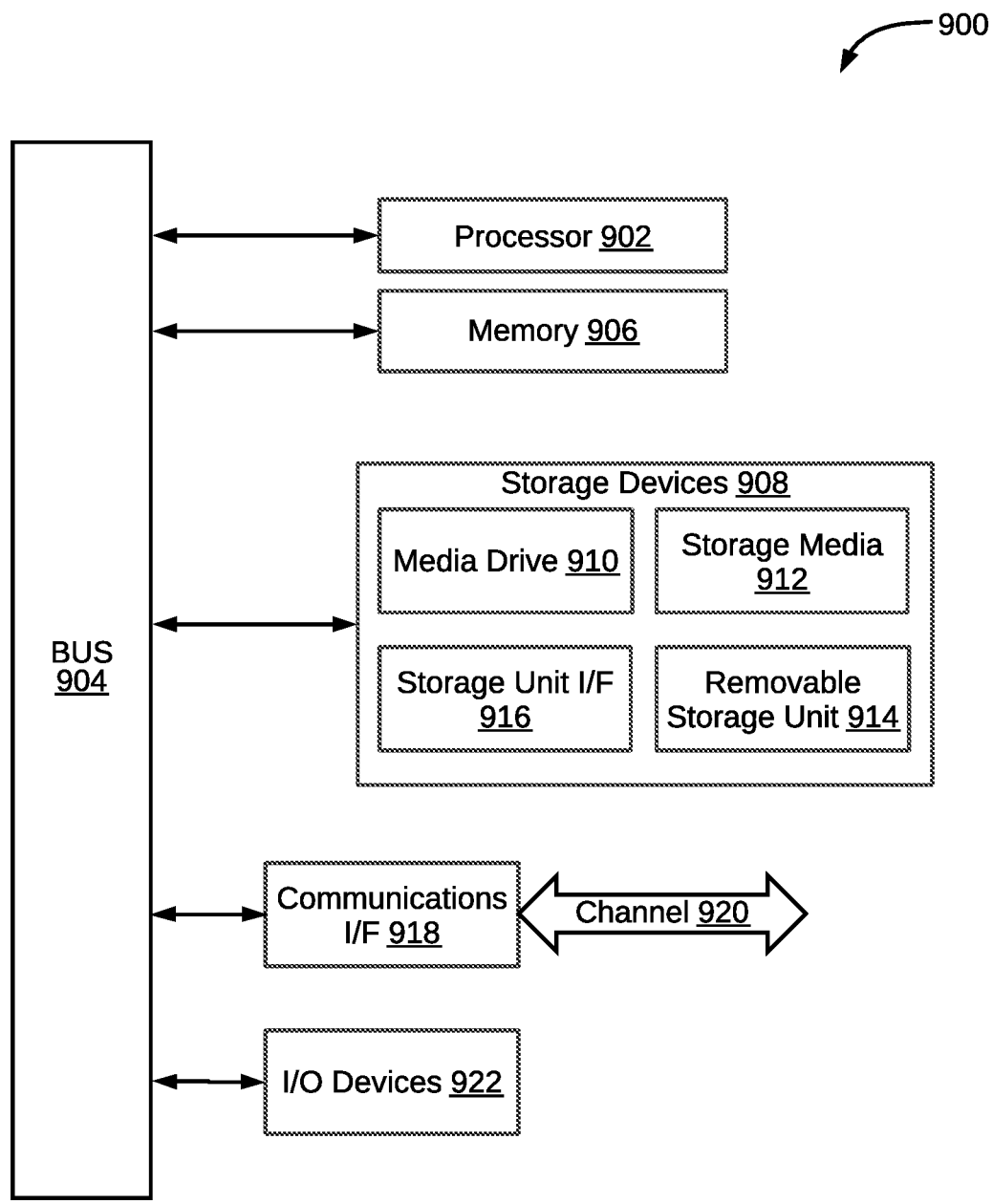
FIG. 9 is a block diagram of an exemplary computer system for implementing various embodiments.

The disclosed methods and systems may be implemented on a conventional or a general-purpose computer system, such as a personal computer (PC) or server computer. Referring now to FIG. 9, an exemplary computing system 900 that may be employed to implement processing functionality for various embodiments (e.g., as a SIMD device, client device, server device, one or more processors, or the like) is illustrated. Those skilled in the relevant art will also recognize how to implement the invention using other computer systems or architectures. The computing system 900 may represent, for example, a user device such as a desktop, a laptop, a mobile phone, personal entertainment device, DVR, and so on, or any other type of special or general-purpose computing device as may be desirable or appropriate for a given application or environment. The computing system 900 may include one or more processors, such as a processor 902 that may be implemented using a general or special purpose processing engine such as, for example, a microprocessor, microcontroller or other control logic. In this example, the processor 902 is connected to a bus 904 or other communication medium. In some embodiments, the processor 902 may be an Artificial Intelligence (AI) processor, which may be implemented as a Tensor Processing Unit (TPU), or a graphical processor unit, or a custom programmable solution Field-Programmable Gate Array (FPGA).

The computing system 900 may also include a memory 906 (main memory), for example, Random Access Memory (RAM) or other dynamic memory, for storing information and instructions to be executed by the processor 902. The memory 906 also may be used for storing temporary variables or other intermediate information during execution of instructions to be executed by the processor 902. The computing system 900 may likewise include a read only memory ("ROM") or other static storage device coupled to bus 904 for storing static information and instructions for the processor 902.

The computing system 900 may also include a storage devices 908, which may include, for example, a media drive 910 and a removable storage interface. The media drive 910 may include a drive or other mechanism to support fixed or removable storage media, such as a hard disk drive, a floppy disk drive, a magnetic tape drive, an SD card port, a USB port, a micro USB, an optical disk drive, a CD or DVD drive (R or RW), or other removable or fixed media drive. A storage media 912 may include, for example, a hard disk, magnetic tape, flash drive, or other fixed or removable medium that is read by and written to by the media drive 910. As these examples illustrate, the storage media 912 may include a computer-readable storage medium having stored therein particular computer software or data.

In alternative embodiments, the storage devices 908 may include other similar instrumentalities for allowing computer programs or other instructions or data to be loaded into the computing system 900. Such instrumentalities may include, for example, a removable storage unit 914 and a storage unit interface 916, such as a program cartridge and cartridge interface, a removable memory (for example, a flash memory or other removable memory module) and memory slot, and other removable storage units and interfaces that allow software and data to be transferred from the removable storage unit 914 to the computing system 900.

The computing system 900 may also include a communications interface 918. The communications interface 918 may be used to allow software and data to be transferred between the computing system 900 and external devices. Examples of the communications interface 918 may include a network interface (such as an Ethernet or other NIC card), a communications port (such as for example, a USB port, a micro USB port), Near field Communication (NFC), etc. Software and data transferred via the communications interface 918 are in the form of signals which may be electronic, electromagnetic, optical, or other signals capable of being received by the communications interface 918. These signals are provided to the communications interface 918 via a channel 920. The channel 920 may carry signals and may be implemented using a wireless medium, wire or cable, fiber optics, or other communications medium. Some examples of the channel 920 may include a phone line, a cellular phone link, an RF link, a Bluetooth link, a network interface, a local or wide area network, and other communications channels.

The computing system 900 may further include Input/Output (I/O) devices 922. Examples may include, but are not limited to a display, keypad, microphone, audio speakers, vibrating motor, LED lights, etc. The I/O devices 922 may receive input from a user and also display an output of the computation performed by the processor 902. In this document, the terms "computer program product" and "computer-readable medium" may be used generally to refer to media such as, for example, the memory 906, the storage devices 908, the removable storage unit 914, or signal(s) on the channel 920. These and other forms of computer-readable media may be involved in providing one or more sequences of one or more instructions to the processor 902 for execution. Such instructions, generally referred to as "computer program code" (which may be grouped in the form of computer programs or other groupings), when executed, enable the computing system 900 to perform features or functions of embodiments of the present invention.

In an embodiment where the elements are implemented using software, the software may be stored in a computer-readable medium and loaded into the computing system 900 using, for example, the removable storage unit 914, the media drive 910 or the communications interface 918. The control logic (in this example, software instructions or computer program code), when executed by the processor 902, causes the processor 902 to perform the functions of the invention as described herein.

Thus, the disclosed method and system overcomes the technical problem of selecting pre-processing and feature selection options by the user. The method and system may facilitate the user to know about entire pipeline parameters so that the user may know about available best pre-processing and feature selection options to be selected to generate a best possible model. Further, by logging all results of all possible combinations across multiple datasets, a meta learning approach may be used to select most optimal pipeline parameters. As may be appreciated, the disclosed system and method provides a very exhaustive approach to achieve most optimal results.

As will be appreciated by those skilled in the art, the techniques described in the various embodiments discussed above are not routine, or conventional, or well understood in the art. The techniques discussed above provide for recommending tuning of parameters to generate a data analytics model. The techniques first identify at a data pre-processing stage for each of a plurality of pre-processing operations, a pre-processing subset from an associated set of predefined pre-processing methods for a predefined objective. Each of pre-processing subset includes. a list of ranked predefined pre-processing methods. The techniques may then identify at a feature selection stage for each of a plurality of feature selection operations, a feature subset from an associated set of predefined feature selection methods for the predefined objective. Each feature subset includes a list of ranked predefined feature selection methods. The techniques may then identify at a model training stage for each of a plurality of model training operations, a training subset from an associated set of predefined model training methods for the predefined objective. Each training subset includes a list of ranked predefined model training methods. The technique may then generate a plurality of data analytics tuples. Each of the plurality of data analytics tuples includes a predefined pre-processing method selected from the associated pre-processing subset, a predefined feature selection method selected from the associated feature subset, and a predefined model training method selected from the associated training subset. Further, the technique may select a data analytics tuple from the multiple data analytics tuples. An output result of the data analytics tuple includes highest ranked results for the predefined objective, and the data analytics tuple corresponds to the data analytics model.

In light of the above mentioned advantages and the technical advancements provided by the disclosed method and system, the claimed steps as discussed above are not routine, conventional, or well understood in the art, as the claimed steps enable the following solutions to the existing problems in conventional technologies. Further, the claimed steps clearly bring an improvement in the functioning of the device itself as the claimed steps provide a technical solution to a technical problem.

The specification has described method and system for identifying vulnerabilities and security risks in an application. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for recommending tuning of parameters to generate a data analytics model, the method comprising:
   identifying via a first plurality of recommendation layers, at a data pre-processing stage, by a recommender device, for each of a plurality of pre-processing operations, a pre-processing subset from an associated set of predefined pre-processing methods for a predefined objective,
   wherein each pre-processing subset comprises a list of ranked predefined pre-processing methods,
   and wherein the pre-processing stage transforms input data into a set of pre-processed data;
   identifying at a feature selection stage, by the recommender device, for each of a plurality of feature selection operations, a feature subset, comprising a list of ranked predefined feature selection methods, from an associated set of predefined feature selection methods for the predefined objective,
   wherein the identifying at the feature selection stage comprises:
     processing at the feature selection stage, through a second plurality of recommendation layers, the set of pre-processed data, a plurality of sets of predefined feature selection methods, and a list of problem types associated with the predefined objective, to generate a transformed data, wherein each set in the plurality of sets of predefined feature selection methods corresponds to a feature selection operation from a plurality of feature selection operations;
     assigning, for each of the plurality of feature selection operations, a rank to each predefined feature selection method in the associated feature subset based on the result of processing through each of the second plurality of recommendation layers; and
     generating for each of the plurality of feature selection operations, the feature subset from the associated set of predefined feature selection methods;
   identifying at a model training stage, by the recommender device, for each of a plurality of model training operations, a training subset from an associated set of predefined model training methods for the predefined objective, wherein each training subset comprises a list of ranked predefined model training methods;
   generating, by the recommender device, a plurality of data analytics tuples, wherein each of the plurality of data analytics tuples comprises a predefined pre-processing method selected from the associated pre-processing subset, a predefined feature selection method selected from the associated feature subset, and a predefined model training method selected from the associated training subset; and selecting, by the recommender device, a data analytics tuple from the plurality of data analytics tuples, wherein an output result of the data analytics tuple comprises highest ranked results for the predefined objective, and wherein the data analytics tuple corresponds to the data analytics model.

2. The method of claim 1, wherein transforming the input data comprises processing at the data pre-processing stage, through the first plurality of recommendation layers, the input data, a plurality of sets of predefined pre-processing methods, and the list of problem types associated with the predefined objective, to generate the set of pre-processed data, wherein each set in the plurality of sets of predefined pre-processing methods corresponds to a pre-processing operation from the plurality of pre-processing operations.

3. The method of claim 2, wherein identifying at the data pre-processing stage comprises:
generating for each of the plurality of pre-processing operations, the pre-processing subset from the associated set of predefined pre-processing methods, based on the result of processing through each of the first plurality of recommendation layers; and
assigning, for each of the plurality of pre-processing operations, a rank to each predefined pre-processing method in the associated pre-processing subset.

4. The method of claim 3, wherein the first plurality of recommendation layers comprises at least one of a predefined statistical and quantitative method layer, a predefined rules and practices layer, and a predefined meta learning-based layer, and wherein the rank is assigned to each predefined pre-processing method based on an associated criteria.

5. The method of claim 1, wherein the second plurality of recommendation layers comprises at least one of a predefined statistical and quantitative method layer, a predefined rules and practices layer, and a predefined meta learning-based layer, and wherein the rank is assigned to each predefined feature selection method based on an associated criteria.

6. The method of claim 1, further comprises processing at a model training stage, through a third plurality of recommendation layers, the transformed data, the plurality of sets of predefined model training methods, and the list of problem types, wherein each set in the plurality of sets of predefined model training methods corresponds to a model training operation from a plurality of model training operations.

7. The method of claim 6, wherein identifying at the model training stage comprises:
generating for each of the plurality of model training operations, the training subset from the associated set of predefined model training methods, based on the result of processing through each of the third plurality of recommendation layers; and
assigning, for each of the plurality of model training operations, a rank to each predefined model training method in the associated training subset.

8. The method of claim 7, wherein the third plurality of recommendation layers comprises at least one of a predefined statistical and quantitative method layer, a predefined rules and practices layer, and a predefined meta learning-based layer, and wherein the rank is assigned to each predefined model training method based on an associated criteria.

9. The method of claim 1, wherein:
the plurality of pre-processing operations comprises at least one of an impute operation, an outlier detection operation, an outlier treatment operation, a rescale operation, and a transform operation;
the plurality of feature selection operations comprises at least one of a correlation operation, a model-based operation, and a feature reduction operation; and
the plurality of model training operations comprises at least one of an algorithm selection operation, a hyper-parameters tuning operation, and a model optimization operation.

10. A system for recommending tuning of parameters to generate a data analytics model, the system comprising:
a recommender device comprising a processor and a memory communicatively coupled to the processor, wherein the memory stores processor-executable instructions, which, on execution, causes the processor to:
identify via a first plurality of recommendation layers, at a data pre-processing stage for each of a plurality of pre-processing operations, a pre-processing subset from an associated set of predefined pre-processing methods for a predefined objective,
wherein each pre-processing subset comprises a list of ranked predefined pre-processing methods,
and wherein the pre-processing stage transforms input data into a set of pre-processed data;
identify at a feature selection stage for each of a plurality of feature selection operations, a feature subset, comprising a list of ranked predefined feature selection methods, from an associated set of predefined feature selection methods for the predefined objective,
wherein the identifying at the feature selection stage comprises:
processing at the feature selection stage, through a second plurality of recommendation layers, the set of pre-processed data, a plurality of sets of predefined feature selection methods, and a list of problem types associated with the predefined objective, to generate a transformed data, wherein each set in the plurality of sets of predefined feature selection methods corresponds to a feature selection operation from a plurality of feature selection operations;
assigning, for each of the plurality of feature selection operations, a rank to each predefined feature selection method in the associated feature subset based on the result of processing through each of the second plurality of recommendation layers; and
generating for each of the plurality of feature selection operations, the feature subset from the associated set of predefined feature selection methods;
identify at a model training stage for each of a plurality of model training operations, a training subset from an associated set of predefined model training methods for the predefined objective, wherein each training subset comprises a list of ranked predefined model training methods;
generate a plurality of data analytics tuples, wherein each of the plurality of data analytics tuples comprises a predefined pre-processing method selected from the associated pre-processing subset, a predefined feature selection method selected from the associated feature subset, and a predefined model training method selected from the associated training subset; and select a data analytics tuple from the plurality of data analytics tuples, wherein an output result of the data analytics tuple comprises highest ranked results for the predefined objective, and wherein the data analytics tuple corresponds to the data analytics model.

11. The system of claim 10, wherein the processor is further configured to transform the input data and comprises processing at the data pre-processing stage, through the first plurality of recommendation layers, the input data, a plurality of sets of predefined pre-processing methods, and the list of problem types associated with the predefined objective, to generate the set of pre-processed data, wherein each set in the plurality of sets of predefined pre-processing methods corresponds to a pre-processing operation from the plurality of pre-processing operations.

12. The system of claim 11, wherein identification at the data pre-processing stage comprises:
  generating for each of the plurality of pre-processing operations, the pre-processing subset from the associated set of predefined pre-processing methods, based on the result of processing through each of the first plurality of recommendation layers; and
  assigning, for each of the plurality of pre-processing operations, a rank to each predefined pre-processing method in the associated pre-processing subset.

13. A computer program product for recommending tuning of parameters to generate a data analytics model, the computer program product being embodied in a non-transitory computer readable storage medium of a recommender device and comprising computer instructions for:
  Identifying via a first plurality of recommendation layers, at a data pre-processing stage for each of a plurality of pre-processing operations, a pre-processing subset from an associated set of predefined pre-processing methods for a predefined objective,
    wherein each pre-processing subset comprises a list of ranked predefined pre-processing methods,
    and wherein the pre-processing stage transforms input data into a set of pre-processed data;
  identifying at a feature selection stage for each of a plurality of feature selection operations, a feature subset, comprising a list of ranked predefined feature selection methods, from an associated set of predefined feature selection methods for the predefined objective,
  wherein the identifying at the feature selection stage comprises:
    processing at the feature selection stage, through a second plurality of recommendation layers, the set of pre-processed data, a plurality of sets of predefined feature selection methods, and a list of problem types associated with the predefined objective, to generate a transformed data, wherein each set in the plurality of sets of predefined feature selection methods corresponds to a feature selection operation from a plurality of feature selection operations;
    assigning, for each of the plurality of feature selection operations, a rank to each predefined feature selection method in the associated feature subset based on the result of processing through each of the second plurality of recommendation layers; and
    generating for each of the plurality of feature selection operations, the feature subset from the associated set of predefined feature selection methods;
  identifying at a model training stage for each of a plurality of model training operations, a training subset from an associated set of predefined model training methods for the predefined objective, wherein each training subset comprises a list of ranked predefined model training methods;
  generating a plurality of data analytics tuples, wherein each of the plurality of data analytics tuples comprises a predefined pre-processing method selected from the associated pre-processing subset, a predefined feature selection method selected from the associated feature subset, and a predefined model training method selected from the associated training subset; and
  selecting a data analytics tuple from the plurality of data analytics tuples, wherein an output result of the data analytics tuple comprises highest ranked results for the predefined objective, and wherein the data analytics tuple corresponds to the data analytics model.

* * * * *